(12) United States Patent
Narita

(10) Patent No.: US 7,474,111 B2
(45) Date of Patent: Jan. 6, 2009

(54) ELECTRICAL PROBE ASSEMBLY WITH GUARD MEMBERS FOR THE PROBES

(75) Inventor: Satoshi Narita, Hirosaki (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/840,942

(22) Filed: Aug. 18, 2007

(65) Prior Publication Data

US 2008/0054927 A1 Mar. 6, 2008

(30) Foreign Application Priority Data

Aug. 22, 2006 (JP) .............................. 2006-224811

(51) Int. Cl.
*G01R 31/02* (2006.01)
(52) U.S. Cl. ..................................... 324/754
(58) Field of Classification Search .................. None
See application file for complete search history.

(56) References Cited

U.S. PATENT DOCUMENTS

| 4,912,399 | A  | * | 3/1990  | Greub et al.    | 324/754 |
|-----------|----|---|---------|-----------------|---------|
| 5,914,613 | A  | * | 6/1999  | Gleason et al.  | 324/754 |
| 6,307,387 | B1 | * | 10/2001 | Gleason et al.  | 324/754 |
| 6,437,584 | B1 | * | 8/2002  | Gleason et al.  | 324/754 |
| 6,838,890 | B2 | * | 1/2005  | Tervo et al.    | 324/754 |
| 6,911,835 | B2 | * | 6/2005  | Chraft et al.   | 324/754 |
| 6,927,585 | B2 | * | 8/2005  | Gleason et al.  | 324/754 |
| 6,930,498 | B2 | * | 8/2005  | Tervo et al.    | 324/754 |
| 7,109,731 | B2 | * | 9/2006  | Gleason et al.  | 324/754 |
| 7,355,420 | B2 | * | 4/2008  | Smith et al.    | 324/754 |
| 7,382,142 | B2 | * | 6/2008  | Chong et al.    | 324/754 |
| 2008/0088332 | A1 | * | 4/2008 | Beaman et al.  | 324/762 |
| 2008/0111571 | A1 | * | 5/2008 | Smith et al.   | 324/754 |

FOREIGN PATENT DOCUMENTS

| JP | 2002-340932   | 11/2002 |
| JP | 2003-149270   | 5/2003  |
| KR | 2000-0059158  | 10/2000 |

OTHER PUBLICATIONS

Official Action for KR20080018101, Jun. 17, 2008, Nihon Micronics KK (JP).

* cited by examiner

*Primary Examiner*—Jermele M Hollington
(74) *Attorney, Agent, or Firm*—Ingrassia Fisher & Lorenz, P.C.

(57) ABSTRACT

The probe assembly has a plurality of probes, a probe base provided with the probes, and a plurality of guard members provided on the probe base. Each probe has an arm portion supported on the probe base at its one end and extending from a mounting surface of the probe base at a distance substantially along the mounting surface. At the other end of each arm portion is formed a tip projecting so as to project in a direction to be away from the mounting surface of the probe base. The guard member is supported on the probe base near at least one side of each arm portion. The guard surface is positioned in the vicinity of the height position of one surface and the opposite other surface of the arm portion opposing the mounting surface of the probe base.

8 Claims, 7 Drawing Sheets

(a) (b)

(a) (b)

(a) (b)

(a)

(b)

ELECTRICAL PROBE ASSEMBLY WITH GUARD MEMBERS FOR THE PROBES

TECHNICAL FIELD

The present invention relates to a probe assembly suitable for use in an electrical inspection of a flat plate-like device under test such as an integrated circuit.

BACKGROUND

Some semiconductor chips use bump electrodes. By direct connection of the bump electrodes and electrodes of a circuit board, semiconductor chips can be mounted on the circuit board. Such semiconductor chips are in general collectively formed on a semiconductor wafer, and undergo an electrical inspection before the semiconductor wafer is separated into respective chips.

In this sort of the electrical inspection, a plurality of chip regions which are devices under test are connected to a tester through a probe assembly in which a plurality of probes are provided to be in contact with electrodes in each chip region on the semiconductor wafer.

Each probe of the probe assembly has an arm portion where a tip is provided. One end of this arm portion is secured to a circuit of a probe base of the probe assembly, and the arm portion extends laterally from the surface of the probe assembly at a distance substantially along the surface of the probe base. At the other end of the arm portion, the tip is formed in a direction to be away from the surface of the probe base (see Patent Document 1).

The probe assembly is relatively pressed toward the semiconductor wafer so that the tip of each probe may contact the corresponding bump electrode. At this time, an overdrive force is applied to each probe so that a slight flexural deformation may occur to the arm portion for a secure contact of each probe with corresponding bump electrode.

In the invention according to Patent Document 1, a projected portion for preventing an excessive deformation of the probe is provided between the probes and the probe base. By a deformation regulating action of this projected portion, an excessive deformation of the arm portion due to excessive overdrive force is controlled, thereby preventing damage to the probe due to the excessive deformation of the arm portion.

However, there is a fear that, if a foreign matter such as a waste of a bump material remains in the vicinity of the bump electrode in the chip region, the foreign matter might hit the arm portion of the probe, even if the vicinity of the tip portion of the arm portion of each probe is deformed toward the chip region of the semiconductor wafer so as to apply a proper overdrive force to the arm portion.

Where the semiconductor chip is an IC driver of a liquid crystal panel, the size and arrangement pitch of the electrodes with which the probes are brought into contact are of a very small value like several decades μm. Therefore, for each probe of the probe assembly for use in such an electrical inspection, a needle member with a small diameter corresponding to the thickness dimension is used. Thus, when subjected to a strong pressing force from the foreign matter when brought into contact with the foreign matter remaining around the electrode, the probes are prone to damage. For this reason, there has been a demand for a probe assembly capable of surely preventing damage to a probe due to interference between such a foreign matter remaining around an electrode and the probe.

Patent Document 1
Japanese Patent Appln. Public Disclosure No. 2002-340932

BRIEF SUMMARY

An object of the present invention is to provide a probe assembly capable of preventing probes from being damaged by foreign matters remaining around electrodes of a device under test.

The probe assembly according to the present invention comprises a plurality of probes, a probe base where the probes are provided, and guard members provided on the probe base. Each probe has an arm portion supported on the probe base at its one end and extending from a mounting surface of the probe base at a distance substantially along the mounting surface. At the other end of the arm portion is formed a tip projecting in a direction to be away from the mounting surface. The guard members are placed at least on one side in the vicinity of each arm portion and supported on the probe base. The guard member has a guard surface which is positioned near the height position of the other surface opposite to one surface of the arm portion facing the mounting surface of the probe base.

In the probe assembly according to the present invention, the guard member disposed at a side of the arm portion displaces integrally with the arm portion when the probe base is relatively pressed toward an electrode of a semiconductor wafer, which is a device under test, so as to apply an overdrive force to the probe. Since the guard member has the guard surface placed near the height position of the other surface of the arm portion, if there is a foreign matter near the electrode, the guard member contacts the foreign matter before or after the foreign matter contacts the probe. When the guard surface of the guard member is brought into contact with the foreign matter, even if the foreign matter has already been brought into contact with the arm portion, the guard member can prevent such a strong pressing force as to give damage to the arm portion of the probe from the foreign matter from acting on the arm portion in spite of continuous relative movement of the probe assembly and the semiconductor wafer, because of an interference between the guard surface and the foreign matter.

Consequently, even if a foreign matter contacts the arm portion of the probe, because of the guarding action of this guard member, the arm portion does not receive such a strong pressing force as to be damaged by the foreign matter, thereby preventing a damage to the arm portion. Also, since an excessive overdrive force due to contact with the foreign matter can be prevented from acting on the arm portion of the probe, without providing a projection to prevent an excessive deformation of a probe as in conventional cases, an excessive deformation of the probe due to contact between the arm portion and the foreign matter can also be prevented.

It is possible to provide at the other end of the arm portion a tip portion extending in a direction to be away from the mounting surface of the probe base and form the tip at the extended end of the tip portion. It is also possible to make the guard surface of the guard member extend along the other surface of the arm portion. The guard surface of the guard member extending along the arm portion prevents damage to the arm portion due to the contact in a broader area.

When the other surface of the arm portion is a flat surface, the guard surface of the guard member may be also made a flat surface. This flat guard surface can be formed at a height position more distant than the other surface of the arm portion from the mounting surface of the probe base. Since this enables the guard surface to interfere with the foreign matter before the foreign matter contacts the arm portion, thereby enabling to prevent the contact between the foreign matter and the arm portion. Consequently, damage due to contact of the arm portion with a foreign matter can be surely prevented.

The guard member may be made of the same material as that of the probe.

The guard members can be arranged in pairs on both sides of each probe. In place of this, the guard members and the probes can be alternately arranged. By this alternate arrangement, the guard members between adjacent probes can be shared, so that without spoiling the guarding action of the probes by the guard member, the number of the arranged guard members can be reduced to about half.

The probe and the guard member can be made by using the photolithographic technique and electroforming technique.

Since in the semiconductor device in which the electrodes are bump electrodes, bump wastes tend to adhere to the neighborhood of the electrode, the probe assembly according to the present invention is particularly effective for an electrical inspection of the semiconductor device with such bump electrodes.

According to the present invention, such an interference between the guard member and the foreign matter as mentioned above surely enables to prevent the arm portion of the probe from being damaged due to a contact with the foreign matter remaining around an electrode of the device under test. Further, such an excessive deformation of the arm portion as to damage the arm portion due to a contact with the foreign matter can also be prevented.

DETAILED DESCRIPTION

Figure 1:
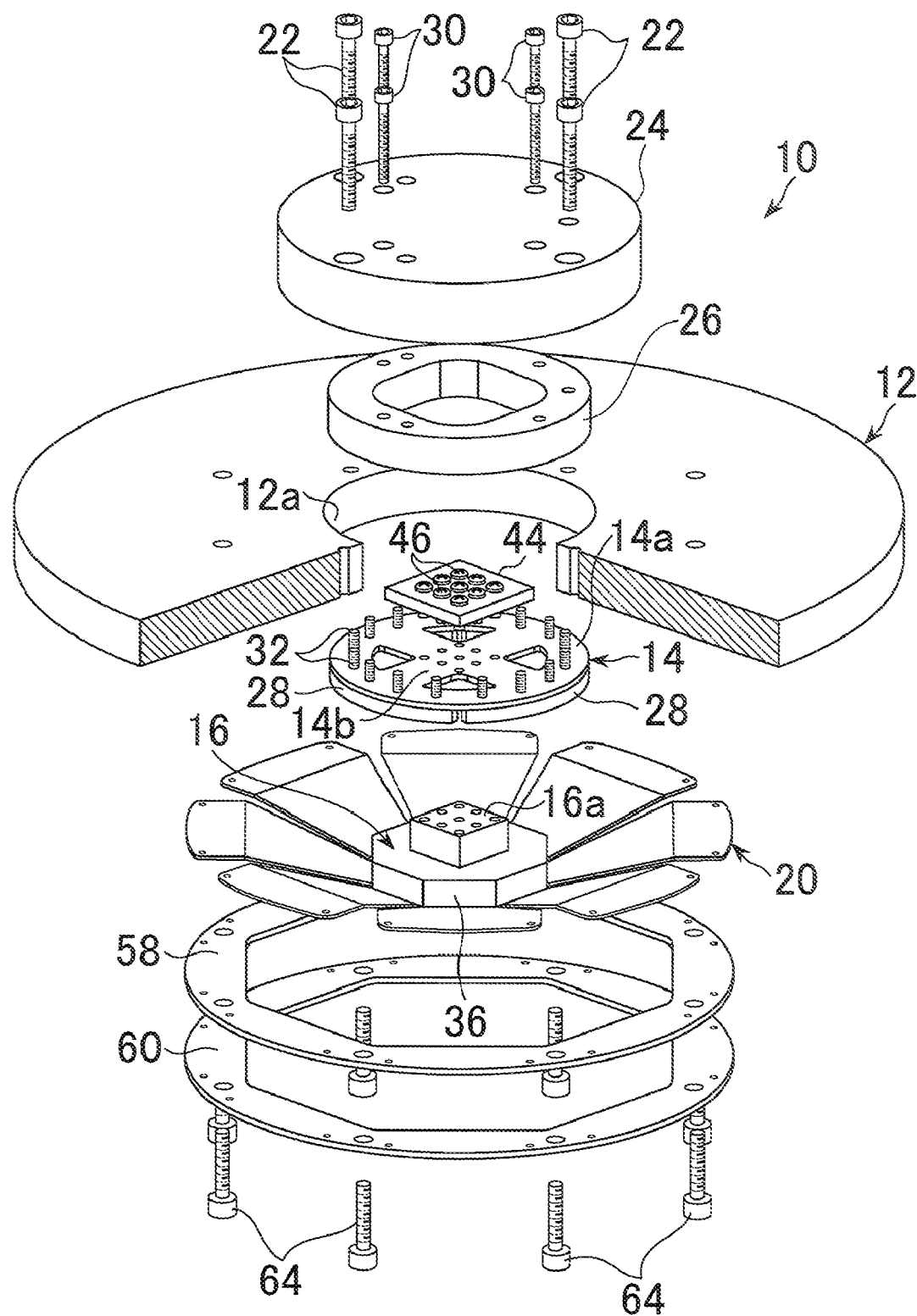
FIG. 1 is a perspective view showing the probe assembly in an exploded state according to the present invention

The probe assembly 10 according to the present invention comprises, as shown in FIG. 1 showing it in an exploded state: a rigid wiring substrate 12; a block 16 elastically supported on the rigid wiring substrate through a spring member 14; and a probe sheet 20 having a probe base 18 (see FIGS. 2 and 3) where a heretofore well-known plural conductive paths are provided to be electrically connected to the plural wirings (not shown) within the rigid wiring substrate 12. In this embodiment, the probe base 18 according to the present invention is used as the central portion of the flexible probe sheet 20.

Figure 2:
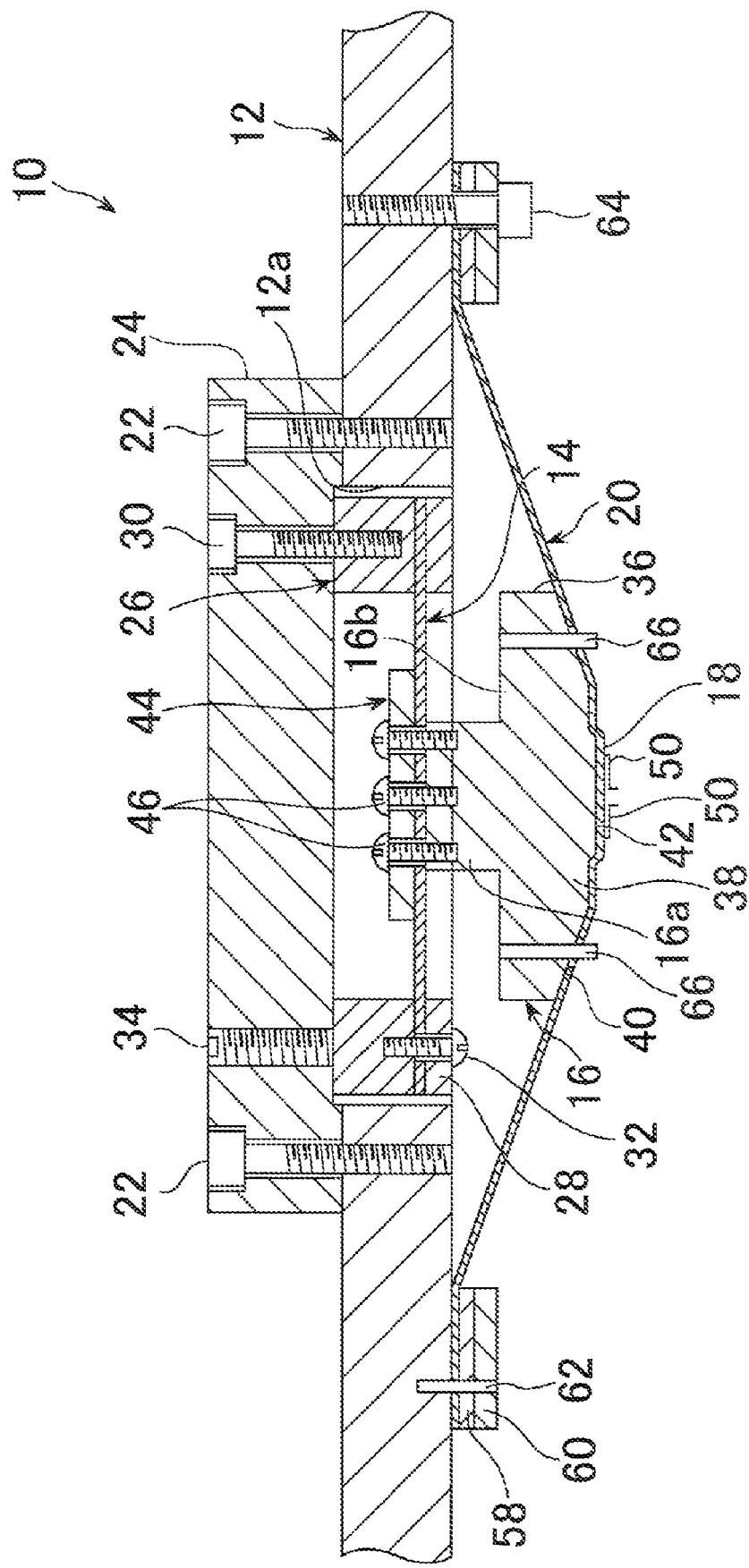
FIG. 2 is a vertical section of the probe assembly shown in FIG. 1.

A wiring line to be connected to an electric circuit of a tester body is formed within the rigid wiring substrate 12 as is heretofore well known, and the rigid wiring substrate 12 has a circular opening 12a at its central portion. In the illustration, as shown in FIG. 2, a circular support plate 24 made of metal such as stainless steel is secured to the upside of the rigid wiring substrate through bolts 22 screwed into the rigid wiring substrate. The support plate 24 supports the rigid wiring substrate 12 to serve to reinforce the rigid wiring substrate.

The spring member 14 is formed by a flat spring material and is retained across the opening within the circular opening 12a of the rigid wiring substrate 12 through a plurality of presser bars 28 to be combined annularly with each other. To retain the spring material 14, a mounting plate 26 is connected to the underside of the support plate 24 through bolts 30, and each presser bar 28 is connected to the mounting plate 26 through bolts 32 penetrating an annular outer edge portion 14a of the spring member 14 screwed into the mounting plate 26.

In the example shown in FIG. 2, a parallel adjustment screw 34 for adjusting the retaining attitude of the spring member 14 with the bolts 30 loosened is screwed into the support plate 24 such that their front ends contact the top surface of the mounting plate 26.

The block 16 is secured to the body portion 14b (see FIG. 1) of the spring member 14 retained within the circular opening 12a of the rigid wiring substrate 12. The block 16 includes a stem portion 16a having a rectangular cross section, and a support portion 16b having a regular octagonal cross section continuous to the lower end of the stem portion. The support portion 16b includes a bottom portion 38 continuous to a pedestal portion 36 having a certain diameter along its axis and having a cross sectional shape similar to its cross sectional shape, and the bottom portion has an outer diameter gradually diminishing toward the lower end. Thus, as shown in FIG. 3, the block 16 includes a flat rectangular support surface portion 42 at the central portion of the area surrounded by a tapered surface 40.

As shown in FIG. 2, the block 16 is connected to the body portion 14b of the spring member 14 at the top surface of the stem portion 16a with a support surface 42 on the bottom portion 38 of the pedestal portion 36 directed downward. For this connection, a fixing plate 44 which sandwiches the body portion 14b in cooperation with the stem portion 16a is secured to the stem portion 16a with screw members 46 to be screwed into the stem portion 16a.

Figure 3:
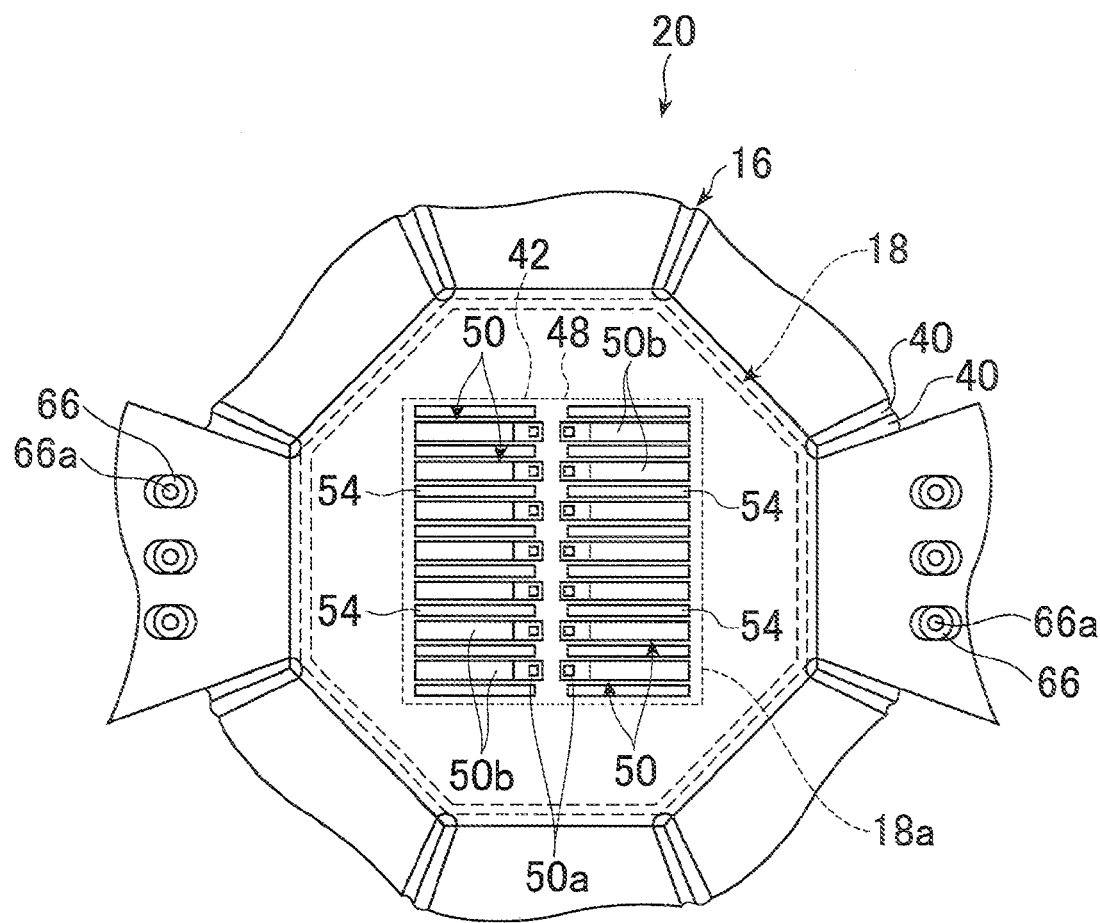
FIG. 3 is a bottom view showing a probe sheet of the probe assembly in FIG. 1 with a part enlarged.

The probe base 18 at the central portion of the probe sheet 20 is, in the example shown in FIG. 3, an octagonal portion formed to correspond to the bottom portion 38 of the block 16. At the central portion of this octagonal portion, a rectangular contact region 48 corresponding to the support surface portion 42 is formed. On one surface of this contact region 48, a plurality of probes 50 are arranged with their tips 50a aligned in two rows.

Figure 4:
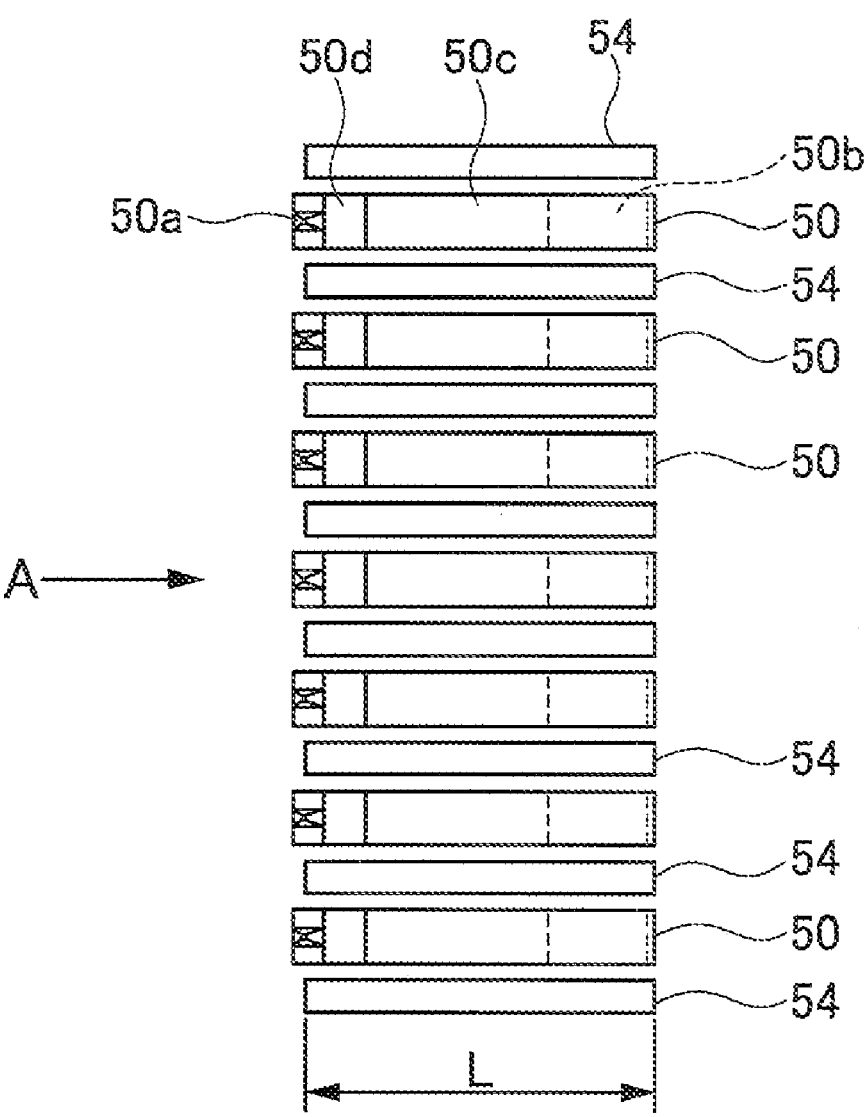
FIG. 4 is a bottom view showing probe rows shown in FIG. 3.
Figure 5:
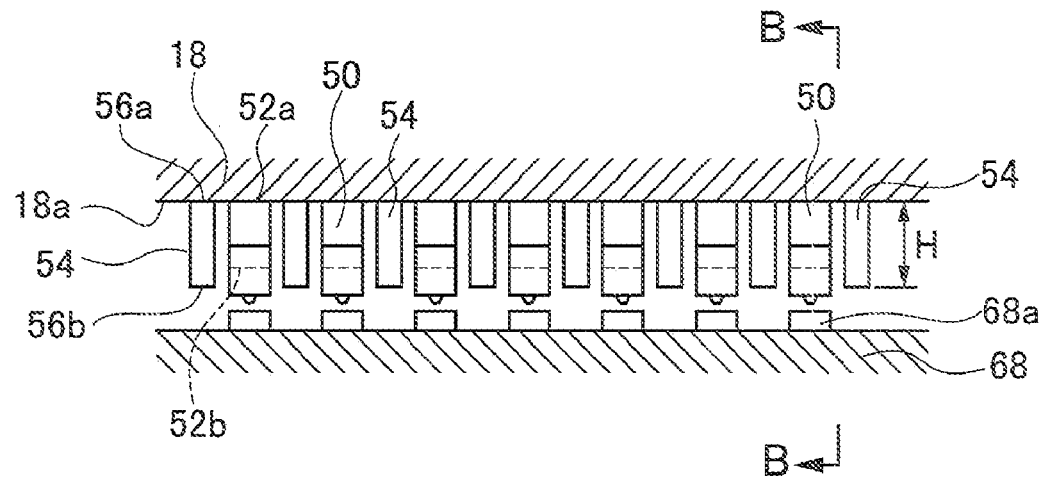
FIG. 5 is a side view of the probe rows seen from the direction of the arrow A shown in FIG. 4.
Figure 6:
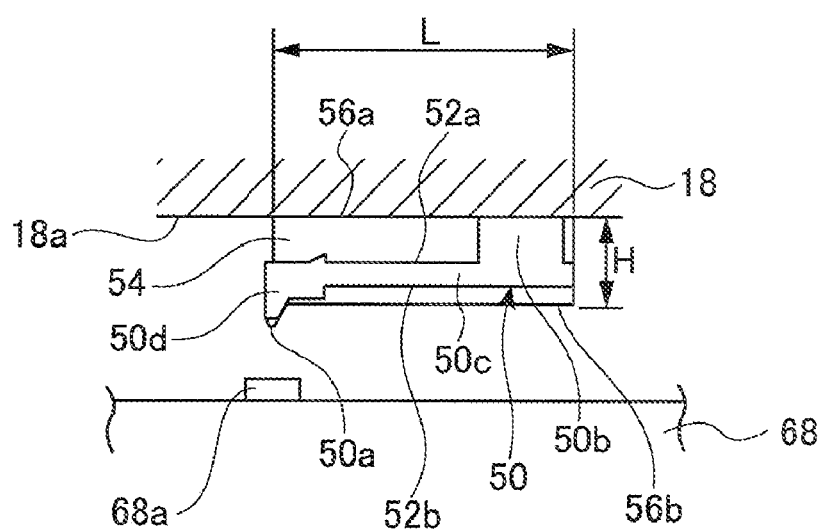
FIG. 6 is a front elevation of the probe rows seen from the direction of the arrow B shown in FIG. 5.

A part of the right probe row of the two rows shown in FIG. 3 is shown typically in FIGS. 4-6 in an enlarged state. FIG. 4 is a bottom view seeing the probe row from the side of the tips 50a, and FIG. 5 is a side view seeing the probe row from the direction indicated by the arrow A in FIG. 4. Further, FIG. 6 is a front vertical section seeing the probe row along the arrow B shown in FIG. 5.

Each probe 50 has, as shown in FIG. 6, an arm portion 50c connected to the probe base 18 through the mounting portion 50b extending downward from the mounting surface 18a which is one surface of the probe base 18, and a tip portion 50d provided in the arm portion. The arm portion 50c extends laterally along the mounting surface 18a of the probe base 18 from the lower end of the mounting portion 50b, and the tip portion 50d is provided at its front end.

The arm portion 50c includes: a flat upside 52a having a rectangular cross sectional shape, opposing the mounting surface 18a and evenly spaced from the mounting surface 18a when the probe 50 is unloaded; and an underside 52b parallel to the upside 52a on the opposite side of the upside. The tip portion 50d has one surface 54a opposing the mounting surface 18a formed at the other end, that is, the front end of the arm portion 50c so as to extend at a distance from the mounting surface 18a when the probe 50 is unloaded in a direction to be away from the mounting surface 18a. The tip 50a is formed at an extended end of the tip portion 50d.

As shown in FIG. 3, in each probe row, tips 50a of the respective probes 50 and the mounting portions 50b are arranged so as to align, and as shown in FIG. 4, the arm portions 50c of the probes 50 adjoining in the direction of alignment are arranged at even intervals from each other. Each probe 50 is electrically connected at its mounting portion 50b to each of the electrically conducting paths within the probe base 18.

Between adjoining probes 50 of each probe row, as shown in FIGS. 3-6, guard members 54 each composed of an elongated rectangular solid is disposed parallel to the probes without contacting the adjacent probes 50. Each guard member 54 is supported on the mounting surface 18a with its one face 56a in contact with the mounting surface 18a, and has a length dimension L from the mounting portion 50b to the tip portion 50d along the arm portion 50c. In the illustration, the underside 56b positioned on the opposite side of one surface 56a of the guard member 54 which is to be a mounting surface on the probe base 18 has a height dimension H lower than the height position of the underside 52b of the arm portion 50c when the probe 50 is unloaded and higher than the height position of the tip 50a.

Thus, when the probes 50 are unloaded, the undersides 56b of the guard members 54, which are alternately arranged with the probes 50 in the arranging direction of the probes 50, are located at a height position which is farther away from the mounting surface 18a of the probe base 18 than the underside 52b of the arm portion c and the mounting surface 18a of the probe base 18 is but nearer than the tip 50a is from the mounting surface 18a.

The probe sheet 20 provided with the probe base 18 where the guard members 54 are provided between adjoining probes 50 is, as shown in FIG. 2, adhered to the underside of the bottom portion through an adhesive so as to be supported on the bottom portion 38 of the block 16 on the opposite surface to the mounting surface 18a with the mounting surface 18a including the probes 50 and the guard members 54 directed downward. Also, the probe sheet 20 has an outer edge portion extending outward from the probe base 18, which is the octagonal portion, connected with the rigid wiring substrate 12.

For the connection of the outer edge portion of the probe sheet 20, an elastic rubber ring 58 is disposed along the outer edge portion of the probe sheet 20, and a fixing ring 60 covering the elastic rubber ring 58 is disposed. The relative positions between the outer edge portion and both members 58, 60 of the probe sheet 20 to the rigid wiring substrate 12 are determined by a positioning pin 62. By fastening screw members 64 penetrating the probe sheet 20 and both members 58, 60 to the rigid wiring substrate 12, the outer edge portion of the probe sheet 20 is connected to the rigid wiring substrate 12. By the connection of the probe sheet 20 to the rigid wiring substrate 12, as in the conventional cases, the conducting path is electrically connected to the corresponding wiring path of the rigid wiring substrate 12. Consequently, each probe 50 is connected to the tester body via the electrically conducting path of the probe sheet 20.

Alignment pins 66 are disposed, if necessary, to penetrate the probe sheet 20. At the lower end of each alignment pin 66 is provided an alignment mark 66a (see FIG. 3) which can be photographed by a camera (not shown) supported on a table (not shown) for retaining a semiconductor wafer 68 (see FIGS. 5 and 6), that is, a device under test.

Since information on the relative position of the probe assembly 10 to the table can be obtained from the photographed alignment mark, and on the basis of the positional information, the relative position of the probe assembly 10 to the support table can be adjusted so that the tip 50a of each probe 50 of the probe assembly 10 may be accurately brought into contact with each corresponding electrode 68a.

Figure 7:
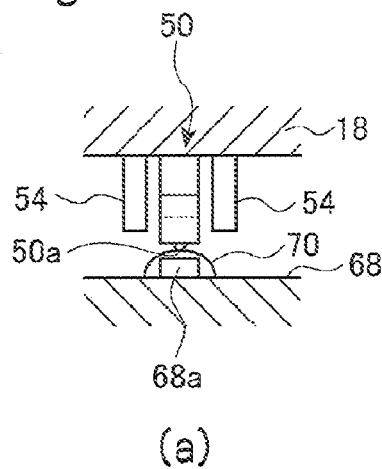
FIGS. 7(a) and (b) show a relation between the probe and the foreign matter in a waiting condition where the tip of the probe of the probe assembly is positioned on the corresponding electrode of the semiconductor wafer, in which (a) is a front elevation like FIG. 5, and (b) a side view like FIG. 6.
Figure 7:
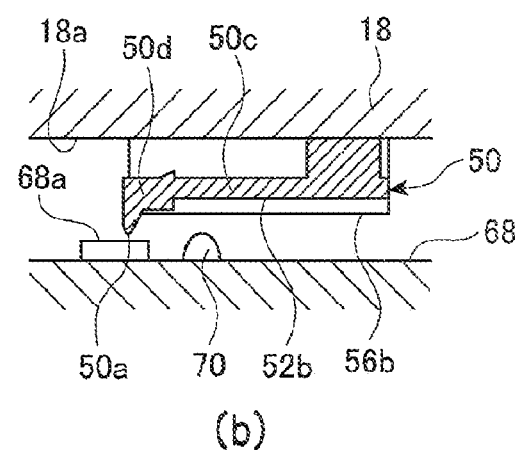

By the adjustment of the relative position between the support table and the probe assembly 10, as shown in FIG. 7(a) and FIG. 7(b), the tip 50a of each probe 50 is retained on the corresponding electrode 68a of the semiconductor wafer 68, that is, a device under test at a distance from the electrode.

Figure 8:
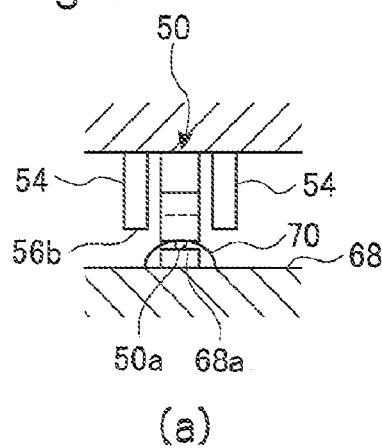
FIGS. 8(a) and (b) show a relation between the probe and the foreign matter in a state where the probe tip of the probe assembly is in contact with the corresponding electrode, in which (a) is a front elevation like FIG. 5, and (b) a side view like FIG. 6.
Figure 8:
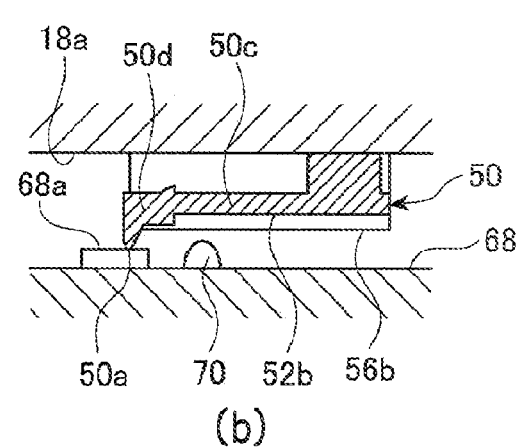

In this state, the table on which the semiconductor wafer 68 is mounted is actuated at a predetermined stroke so as to rise toward the rigid wiring substrate 12 retaining the probe assembly 10. By the actuation of the table, each probe 50 of the probe assembly 10 retained on the rigid wiring substrate 12 is moved relatively toward the semiconductor wafer 68. By this relative movement of the probe 50, as shown in FIG. 8(a) and FIG. 8(b), the tip 50a of each probe 50 is brought into contact with the corresponding electrode 68a.

After the contact between the tip 50a and the electrode 68a, subsequently the probe assembly 10 is relatively moved toward the semiconductor wafer 68 integrally with the rigid wiring substrate 12 so as to ensure further electrical contact between them. As a result, as shown in FIG. 9(a) and FIG. 9(b), an appropriate overdrive force acts so that a proper upward warping may occur to each arm portion 50c in a state that the tip 50a of each probe is brought into contact with the electrode 68a.

Where an appropriate overdrive force acts on the arm portion 50c of each probe 50, a secure electrical contact between the probe 50 and the electrode 68a of the semiconductor wafer 68 is performed. Thus, the semiconductor wafer 68 is surely connected to the tester body, thereby enabling to conduct an accurate electrical inspection of the device under test 68 by the tester body.

As regards the probe assembly 10 of the present invention, as shown in FIG. 7(a) and FIG. 7(b), suppose a case where there is a foreign matter 70 at a position near the electrode 68a on the semiconductor wafer 68.

Figure 9:
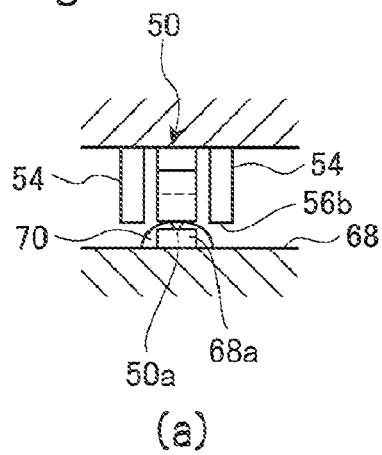
FIGS. 9(a) and (b) show a relation between the probe and the foreign matter in a state where an overdrive force is acting on the probe of the probe assembly.
Figure 9:
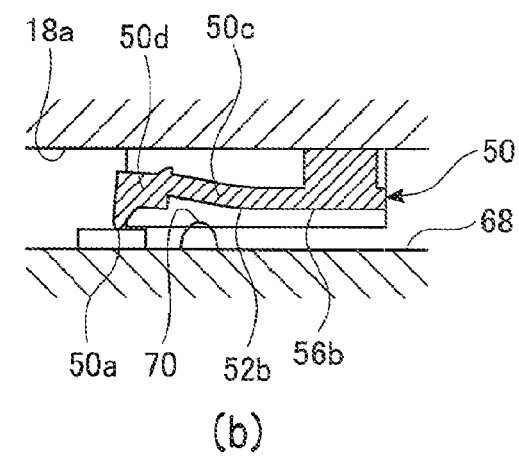

As shown in FIG. 8(a) and FIG. 8(b), in a state that each tip 50a is brought into contact with the corresponding electrode 68a, even where the top portion of the foreign matter 70 is at a distance from the other surface, that is, the underside 52b of the arm portion 50c, there is a fear that the top portion of the foreign matter 70 might contact the underside 52b of the arm portion 50c if the tip 50a of the probe 50 is continuously pressed against the electrode 8a, as shown in FIG. 9(a) and FIG. 9(b).

In the probe assembly 10 of the present invention, however, the probe base 18 is provided with the guard members 54. Each of the guard members 54 has the underside 56b extending along the underside 52b of the arm portion on the sides of the arm portion 50c of each probe 50. Moreover, in the illustration, the distance of the underside 56b of the guard member 54 from the mounting surface 18a of the probe base 18 is greater than that of the underside 52b of the arm portion 50c. Consequently, the underside 56b of the guard member 54 is projected to be lower than the underside 52b of the arm portion 50c.

Therefore, as shown in FIG. 9(a) and FIG. 9(b), when an overdrive force acts on the probe 50, the top portion of the foreign matter 70 is likely to contact the underside 52b of the arm portion 50c, but the underside 56b of the guard member 54 located at a lower position than the underside contacts the top portion of the foreign matter 70, so that the guard member 54 prevents contact between the arm portion 50c of the probe 50 and the foreign matter 70.

Figure 10:
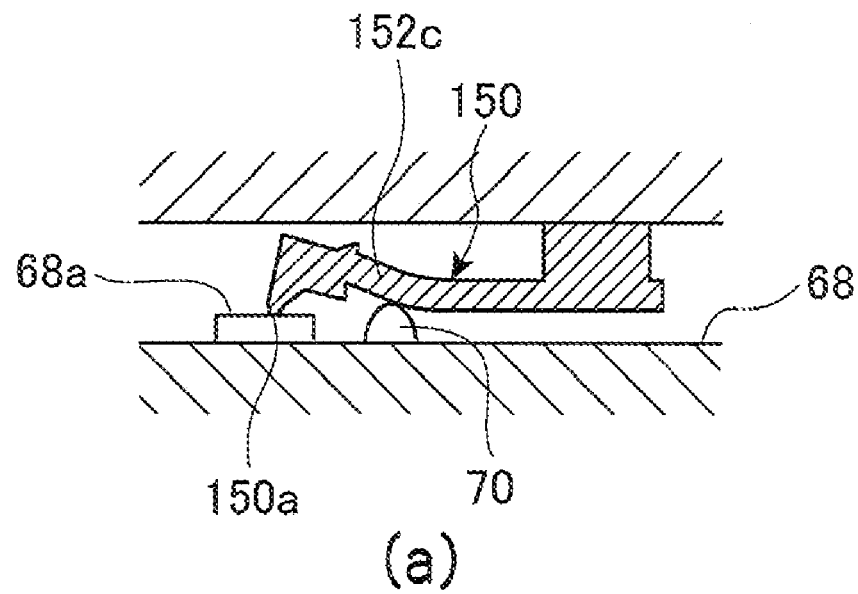
FIGS. 10(a) and (b) show a relation between the probe tip and the foreign matter in a conventional probe assembly, in which (a) is a view like FIG. 8(b) showing a relation between the probe and the foreign matter in a state where the probe tip is in contact with the corresponding electrode, and (b) a view like FIG. 9(b) showing a relation between the probe and the foreign matter in a state where the overdrive force is acting on the probe.
Figure 10:
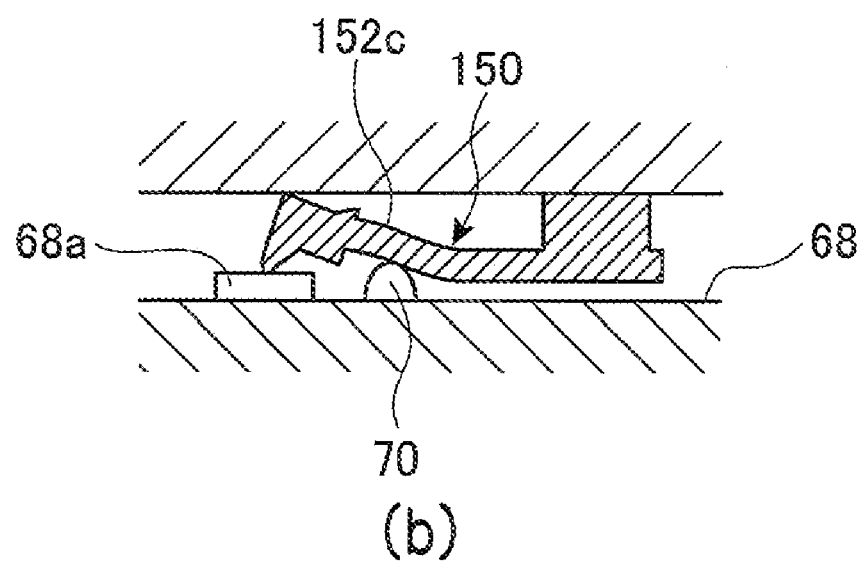

In the conventional structure without the guard member 54 on the sides of the probe 150, as shown in FIG. 10(a) and FIG. 10(b), if there is a foreign matter 70 near the electrode 68a, the foreign matter 70 sometimes contacts the arm portion 50c of the probe 150. Further, before the tip 150a of the probe 150 contacts the corresponding electrode 68a, the foreign matter 70 sometimes contacts the arm portion 150c.

In such a case, where the tip 150a begins to contact the electrode 68a, as shown in FIG. 10(a), the foreign matter 70 brought into contact with the arm portion 150c pushes up the arm portion 150c. Therefore, in the arm portion 150c, a great flexural deformation is introduced into the arm portion 150c already in a state that the tip 150a begins to contact the electrode 68a. Also, as shown in FIG. 10(b), when the probe 150 is moved toward the semiconductor wafer 68 at a predetermined stroke so as to make the probe 150 exert a predetermined overdrive force on the probe 150, the foreign matter 70 is strongly thrust upon the arm portion 150c. Thus, the arm portion 150c is damaged by the strong contact with the foreign matte 70. Also, because of an excessive flexural deformation caused to the arm portion 150c, breakage occurs to the probe 150.

On the other hand, by the probe assembly according to the present invention, as mentioned above, due to the interference by the contact between the guard member 54 and the foreign matter 70, contact between the foreign matter 70 and the arm portion 50c is prevented, thereby preventing a damage to the arm portion 50c due to the contact with the foreign matter 70.

Further, as mentioned above, by making the undersides 56b of the guard members 54 composed of block bodies arranged alternately with the probes 50 positioned lower than the underside 52b of the arm portion 50c, contact between the arm portion 50c and the foreign matter 70 can be prevented even in a state of contact as shown in FIG. 9(a) and FIG. 9(b). It is, therefore, possible to surely prevent excessive deformation of the probes 50 under an overdrive force, and to surely prevent breakage of the probes 50 due to the excessive overdrive.

Where a plurality of probes 50 are successively formed from their tips 50a on a base not shown by use of the heretofore well-known photolithographic technique and electroforming technique, the guard members 54 can be formed simultaneously with these probes 50. In this case, the guard members 54 are made of the same metal material as that of the probes 50.

In place of this, it is possible to mold the guard members 54 of an electrically insulating resin material and adhere it to the mounting surface 18a of the probe base 18 with an adhesive or the like. It is, however desirable, to form the guard members 54 simultaneously with the probes 50 as mentioned above so as to simplify the process.

In place of arranging the guard members 54 alternately with the probes 50, it is possible to arrange a pair of guard members 54 which are exclusively used for each probe on both sides of each probe 50. However, the aforementioned alternate arrangement is desirable for saving the space The underside 56b of each guard member 54 can be located slightly above the underside 52b of the probe 50, that is, at a position near the mounting surface 18a. In this case, it is impossible to surely prevent the contact between a foreign matter 70 and the probe 50. It is, however, possible to prevent such a strong pressing force as to give a damage from acting from the foreign matter 70 on the arm portion 50c of the probe 50, and to prevent such excessive deformation as to give breakage from acting on the arm portion 50c.

In the foregoing is shown an example where the guard member 54 is composed of a block body, but in place of this, it is possible to extend each of the columnar guard members downward from the mounting surface 18a so that the guard members may be arranged along the arm portions 50c of the probes 50.

The present invention is not limited to the above embodiments but can be variously modified without departing from its purport.

What is claimed is:

1. A probe assembly for use in an electrical inspection of a semiconductor device in which electrodes are formed, comprising:
   a plurality of probes;
   a probe base for retaining said probes so that tips of said probes may contact said electrodes, said probe base having a probe mounting surface; and
   guard members provided on said probe base; wherein
   each probe has an arm portion comprising a first end and a second end, the arm portion supported on said probe base at its first end and extending from the probe mounting surface of said probe base at a distance substantially along the probe mounting surface, and each probe has a tip formed at the second end of said arm portion that extends in a direction away from said probe mounting surface of said probe base;
   said guard members are located in the vicinity of each probe such that each probe has at least one of said guard members adjacent thereto;
   said guard members do not contact said probes;
   each guard member is supported on, and extends away from, said probe mounting surface; and
   each guard member terminates at a guard surface that extends from said probe mounting surface further than the arm portion of its adjacent probe.

2. The probe assembly claimed in claim 1, wherein the second end of said arm portion is provided with a tip portion extending in a direction away from said probe mounting surface of said probe base, wherein said tip is formed at an extended end of said tip portion, and wherein said guard surface of each guard member extends along an underside surface of said arm portion.

3. The probe assembly claimed in claim 2, wherein said underside surface of said arm portion is a flat surface, wherein said guard surface of said guard member is a flat surface, and wherein said guard surface is at a height position farther from said probe mounting surface of said probe base than the underside surface of said arm portion.

4. The probe assembly claimed in claim 1, wherein said guard member is made of the same material as that of said probe.

5. The probe assembly claimed in claim 1, wherein said guard members are arranged in pairs on both sides of the respective probes.

6. The probe assembly claimed in claim 1, wherein said guard members and said probes are alternately arranged.

7. The probe assembly claimed in claim 1, wherein said probe and guard member are formed by use of the photolithographic technique and electroforming technique.

8. The probe assembly claimed in claim 1, wherein said electrodes of said semiconductor device are bump electrodes.

\* \* \* \* \*